United States Patent [19]
Yamashita et al.

[11] Patent Number: 5,034,200
[45] Date of Patent: Jul. 23, 1991

[54] CRYSTAL PULLING APPARATUS AND CRYSTAL PULLING METHOD

[75] Inventors: Youji Yamashita, Yokohama; Masakatu Kojima, Yokosuka, both of Japan

[73] Assignee: Kabushiki Kaisha Toshiba, Kawasaki, Japan

[21] Appl. No.: 449,405

[22] Filed: Dec. 19, 1989

Related U.S. Application Data

[63] Continuation of Ser. No. 301,286, Jan. 25, 1989, abandoned.

[30] Foreign Application Priority Data

Jan. 27, 1988 [JP] Japan ................. 63-16047

[51] Int. Cl.$^5$ ............. C30B 15/12; C30B 35/00
[52] U.S. Cl. ................... 422/249; 156/605; 156/617.1; 156/DIG. 115
[58] Field of Search .............. 422/245, 248, 249; 156/617.1, 620.2, 605, DIG. 64, DIG. 70, DIG. 115

[56] References Cited

U.S. PATENT DOCUMENTS

| | | | |
|---|---|---|---|
| 2,809,136 | 10/1957 | Mortimer | 156/608 |
| 3,078,151 | 2/1963 | Kappelmeyer | 422/249 |
| 3,716,345 | 2/1973 | Grabmaier | 422/249 |
| 4,036,595 | 7/1977 | Lorenzini et al. | 422/249 |
| 4,190,631 | 2/1980 | Dewees et al. | 156/608 |
| 4,246,064 | 1/1981 | Dewees et al. | 156/608 |
| 4,353,875 | 10/1982 | Yancey | 422/249 |
| 4,456,499 | 6/1984 | Lin | 156/608 |
| 4,609,425 | 9/1986 | Mateika et al. | 156/617.1 |
| 4,659,421 | 4/1987 | Jewett | 156/608 |
| 4,894,206 | 1/1990 | Yamashita et al. | 422/249 |

FOREIGN PATENT DOCUMENTS 2084046 4/1982 United Kingdom ............. 156/620.4

OTHER PUBLICATIONS

Brice, J. C., "Crystal Growth Processes", Halsted Press, John Wiley and Sons, New York 1986.
Ghandi, *VLSI Fabrication Principles*, John Wiley & Sons, 1983, p. 91.

Primary Examiner—Gary P. Straub
Assistant Examiner—Stephen G. Kalinchak
Attorney, Agent, or Firm—Finnegan, Henderson, Farabow, Garrett, and Dunner

[57] ABSTRACT

A crystal pulling apparatus of double structure crucible has a crucible body which is divided into inner and outer chambers by a cylindrical partition wall coaxially disposed in the crucible body. A melt supplying path used to supply melt from the outer chamber of the crucible to the inner chamber in which the crystal is pulled is formed of a small through hole formed in the partition wall or the small through hole and a pipe-like passage formed in communication with small through hole. The radius of the inner chamber of the double structure crucible has a specified relation determined by the segregation coefficient of dopant impurity with respect to the radius of the outer chamber. This is, the radius of the inner chamber is set substantially equal to $\sqrt{k}$ times the radius of the outer chamber when the segregation coefficient of the dopant impurity is k. In the crystal pulling apparatus with the double structure crucible, a small chamber for introducing dopant is disposed in the outer chamber of the crucible to be in communication with the inner chamber.

11 Claims, 4 Drawing Sheets

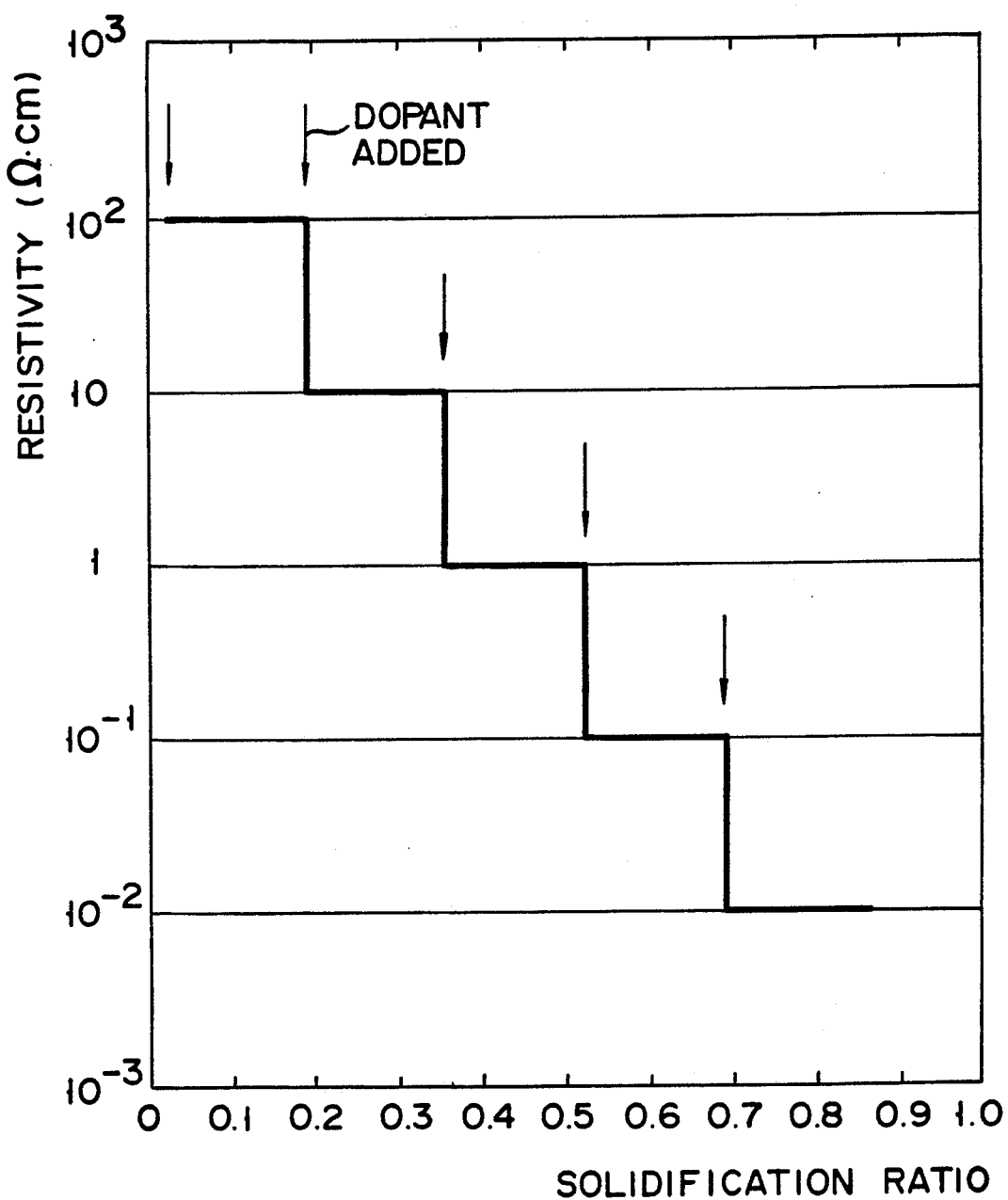
F I G. 4

CRYSTAL PULLING APPARATUS AND CRYSTAL PULLING METHOD

This application is a continuation of application Ser. No. 07/301,286 filed Jan. 25, 1989, now abandoned.

BACKGROUND OF THE INVENTION

1. Field of the Invention

This invention relates to a crystal pulling apparatus for growing rod-like semiconductor single crystals in a crucible receiving melt and a crystal pulling method utilizing the crystal pulling apparatus to grow the semiconductor single crystal whose impurity concentration is altered in a stepwise fashion.

2. Description of the Related Art

Conventionally, when a rod-like semiconductor single crystal (which is also called ingot) is grown from the melt in the crucible by the Czochralski technique (CZ technique), impurity concentration distribution C in the longitudinal direction of the grown single crystal is given as follows as is well known in the art.

$$C = kC_0(1-G)^{k-1}$$

where k is a segregation coefficient of dopant, $C_0$ is an initial impurity concentration and G is solidification rate. Thus, the impurity concentration distribution in the longitudinal direction of he single crystal is almost definitely determined by the type and initial amount of dopant.

For the above reason, in the CZ technique, it is necessary to pull and grow single crystal ingots of the same number as or more than the required number of impurity concentration levels when it is required to form a certain number of single crystal wafers having impurity concentration levels which are significantly different from one another. Therefore, the efficiency of producing single crystals is lowered. Further, when the necessary amount of single crystal wafers having the desired impurity concentration is relatively small with respect of the amount of a single ingot, a large portion of the produced ingot is wasted, thus lowering the yield of material. When the range of desired impurity concentration distribution is extremely narrow and a large number of wafers having the desired impurity concentration is required, it becomes necessary to grow a large number of ingots in order to obtain the desired number of wafers. Also, in this case, a large portion of the ingots are wasted, lowering the yield of material.

A floating zone technique (FZ technique) is also known to grow single crystals. According to this method, it is possible to grow a crystal having desired impurity concentration values in desired portions thereof in the longitudinal direction of one single crystal ingot. In this case, the above requirements can be satisfied without lowering the efficiency of single crystal production and the yield of material. However, it is generally known that the distribution of dopant impurity in the cross section of the single crystal formed by the FZ technique is extremely non-uniform in comparison with that of the single crystal formed by the CZ technique. When, for example, (100) Si single crystal is used, in-plane distribution $\Delta\rho$ of resistivity $\rho$ of phosphorus (P) doped product is 4 to 10% in the case of CZ technique. In contrast, it is 20 to 50 % in the case of FZ technique ((111) crystal is used in FZ technique). When the maximum and minimum values of $\rho$ are expressed by $\rho_{max}$ and $\rho_{min}$, then the following equation is obtained.

$$\Delta\rho = (\rho_{max} - \rho_{min})/\rho_{min}$$

SUMMARY OF THE INVENTION

An object of this invention is to provide a crystal pulling apparatus and a crystal pulling method for growing rod-like single crystals having impurity concentration varying stepwise in the longitudinal direction thereof in the same manner as the conventional CZ technique and without lowering the efficiency of single crystal production and the yield of material and without causing extremely non-uniform in-plane distribution of impurity concentrations which occur in the conventional FZ technique. In this case, it is possible to efficiently form various impurity-concentration wafer groups each including a small number of wafers which have the same impurity concentration.

The crystal pulling apparatus of this invention is attained by utilizing an apparatus having a double structure crucible by which the impurity concentration in the longitudinal direction of the pulled crystal can be theoretically made constant for forming various impurity-concentration wafer groups each including a small number of wafers which have the same impurity concentration. In the double structure crucible type pulling apparatus, the inner space of he crucible body is divided into inner and outer chambers by a cylindrical partition wall set concentrically with the crucible body. A melt supplying path, for supplying melt in the outer chamber of the crucible to the inner chamber in which a crystal is pulled, is formed of a small through hole in the partition wall, or the small through hole and a pipe-like passage formed in communication with the through hole. The diameter of the inner chamber of the double structure crucible has a specified relation determined by the segregation coefficient of the dopant impurity with respect to the diameter of the outer chamber. That is, when the segregation coefficient of the dopant impurity is k, the diameter of the inner chamber is set to be equal to $\sqrt{k}$ times the diameter of the outer chamber.

The crystal pulling apparatus of this invention is featured in that the double structure crucible type apparatus is used, and a small chamber formed in communication with the inner chamber for dopant injection is provided in the outer chamber of the crucible.

In the crystal pulling method of this invention, doped melt is put into the inner chamber of the double structure crucible and undoped melt is put into the outer chamber. Then, the crystal pulling process is effected while the undoped melt in the outer chamber is being supplied to the inner chamber via the melt supplying path formed in the partition wall. In this case, a necessary amount of dopant is supplied into the small chamber in the crystal pulling process. As a result, the impurity concentration of the melt in the inner chamber is set to a preset value which is different from the initial value, thus attaining two different impurity concentration values in the pulled single crystal. If the same operation is effected repeatedly as required, a single crystal having an impurity of the same type whose impurity concentration becomes larger in a stepwise fashion towards the lower portion, or having different impurity concentration regions, can be grown by the crystal pulling method.

The pipe-like passage is formed in communication with the small through hole so as to act as the melt supplying path provided in the crucible used in this invention. The pipe-like passage functions to prevent impurities from flowing from the inner chamber to the outer chamber by diffusion, convection and vortex, even in particular conditions such as melting or neckdown in which, usually, some melt is transferred from the outer chamber to the inner chamber.

One of the features of this invention is that the small chamber is provided in the outer chamber of the crucible. Dopant is supplied to the small chamber and is dissolved therein, so that thermal shock to the grown crystal at the time of dopant injection can be alleviated or small particles of injected dopant can be prevented from being attached to the crystal growing interface, causing dislocation of the growing single crystal.

The impurity concentration in the longitudinal direction of the single crystal is made constant in the double structure crucible apparatus based on the following theory. In a case where the cross section of the double structure crucible having the inner and outer chambers integrally formed shown concentric circles, the following equation is satisfied at the height of the surface of the melt to be pulled.

$$r = \sqrt{k} \cdot R$$

where R is the radius of the outer chamber, r is the radius of the inner chamber and k is the segregation coefficient of the impurity.

Assume now that the melt in the outer chamber is undoped, the melt in the inner chamber is doped with impurity concentration (Ci), and crystal with impurity concentration (kCi) is pulled from the inner chamber and the height of the upper surface of the melt decreases by an infinitesimal amount $\Delta H$ while undoped melt is being supplied from the outer chamber. Then, the total amount of impurity introduced into the crystal during this time is $\pi R^2 \Delta H \times kCi$. The amount of impurity originally existing in the melt of height $\Delta H$ in the inner chamber can be derived as follows using the relation of $r = \sqrt{k} \cdot R$.

$$\pi r^2 \Delta H \times Ci$$

$$= \pi R^2 \Delta H \times kCi$$

Thus, the impurity amount coincides with the total amount of impurity introduced into the crystal.

That is, the amount of impurity originally existing in the melt of height $\Delta H$ in the inner chamber can be all introduced into the growing crystal, and thus the impurity concentration of the melt can be set at a constant value kCi and hence the impurity concentration of the grown crystal can be set at a constant value kCi.

For example, values $\sqrt{k}$ of phosphorus (P), boron (B) and antimony (Sb) are 0.59, 0.89 and 0.14. Judging from these values, and, in particular, phosphorus (P) and boron (B) will be effective in this invention.

The timing of first doping is different in the case where the melt supplying path for connecting the inner chamber to the outer chamber is formed of only the small through hole in the partition wall, and in the case where the melt supplying path is formed of the small through hole and the pipe-like passage connected to the small through hole. In the case where the melt supplying path is formed of only the small hole, it is preferable to effect the first doping after polysilicon material, introduced into the inner and outer chambers, has been subjected to the melting process and the crystal pulling has been subjected to the neckdown process, and after the pulling crystal arrives at the stage of a crown. This is because almost no melt is transferred from the outer chamber into the inner chamber in the melting and neckdown processes. If the first doping is done before the crown, dopant impurity will flow from the inner chamber to the outer chamber, thus resulting in a non-uniform resistance distribution in the longitudinal direction of the pulling crystal.

In the case where the melt supplying path includes the pipe-like passage, dopant impurity is prevented from flowing from the inner chamber to the outer chamber even when no or little melt is transferred from the outer chamber into the inner chamber. Therefore, the first doping may be effected after the melting process is effected and the upper surface levels of melt in the inner and outer chambers become substantially equal.

The existence of the pipe-like passage seems to be unimportant in this invention. However, in the case of growing a Si single crystal, for example, dislocation will easily be caused in the crystal in the initial stage of crystal growth, and it is often necessary to melt the crystal back and pull it again. At this time, the amount of impurity flowing from the inner chamber to the outer chamber corresponds to the meltback amount in the case of the presence of the pipe-like passage. However, in the case of the absence of the pipe-like passage, a large amount of impurity flows from the inner chamber to the outer chamber during the meltback period, and the impurity concentration of the melt in the inner chamber becomes substantially equal to that in the outer chamber. Thus, the uniform resistance distribution in the longitudinal direction of the pulling crystal is completely broken. As described above, when the pipe-like passage is used, it becomes possible to cope with the pulling failure occurring in the initial crystal pulling stage in which dislocation can easily occur.

BRIEF DESCRIPTION OF THE DRAWINGS

FIG. 4 is a graph showing the stepwise variation of resistivity of a single crystal rod obtained by the crystal pulling method of this invention using the apparatus of FIG. 1;

DETAILED DESCRIPTION OF THE PREFERRED EMBODIMENTS

There will not be described embodiments of this invention for growing silicon single crystals with reference to FIGS. 1 to 8.

First, the whole structure of the apparatus according to one embodiment is explained with reference to FIG. 1 (conceptional view). For simplicity of explanation, a container (a chamber of the pulling apparatus) for containing the hot zone including the crucible, heat insulating cylinder and heater are omitted. FIG. 2 is a plan view of a double structure crucible of the apparatus shown in FIG. 1.

Figure 1:
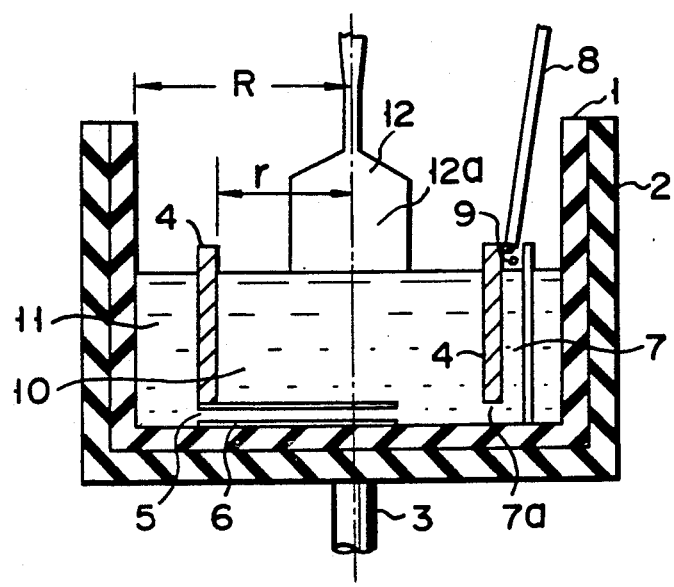
FIG. 1 is a detailed sectional view of a portion of a crystal pulling apparatus using a double crucible according to one embodiment of this invention.
Figure 2:
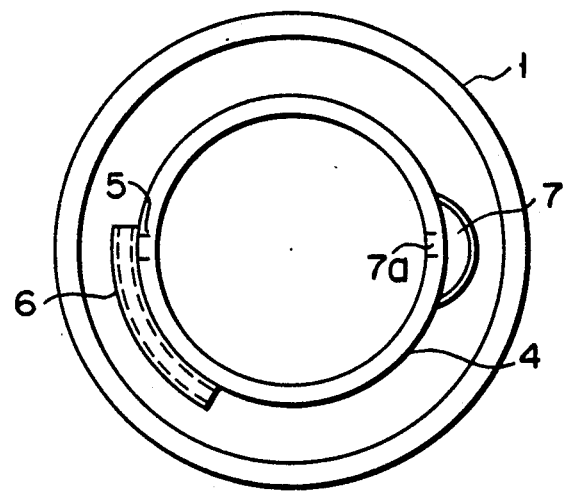
FIG. 2 is a top plan view of the double crucible of FIG. 1.

In FIG. 1, 2 denotes a graphite crucible fixed on crucible shaft 3 which is mounted to be vertically movable and rotatable, and 1 denotes an outer crucible of quartz in the form of a cylindrical container mounted in close contact with the inner surface of graphite crucible 2. Outer crucible 1 is held and reinforced by graphite crucible 2. As shown in FIG. 1, quartz cylindrical partition wall 4 having partition wall penetrating hole 5 and quartz pipe-like passage 6 in connection with hole 5 is mounted in outer crucible 1.

Cylindrical partition wall 4 is fixed by fusion to the inner bottom surface of outer crucible 1. Thus, inner chamber 10 for receiving doped melt (Si) is formed in partition wall 4, and outer chamber 11 for receiving undoped melt (Si) is formed between partition wall 4 and the side wall of outer crucible 1.

Pipe 6 is formed with a inner-diameter of 6 m to ensure that melt can be smoothly supplied, and a length of 150 mm to ensure the complete limitation of impurity diffusion (these values are determined by experiment). As shown in FIG. 2, pipe 6 is fixed by fusion to the outer curved surface of cylindrical wall 4. In FIG. 2, 7 denotes a small chamber for dopant mounted on part of partition wall 4 and connecting at lower portion $7a$ thereof with inner chamber 10. In this embodiment, as shown in FIG. 2, small chamber 7 is formed to project outwardly from partition wall 4 and have a high semicylindrical shape. The diameter of communicating hole $7a$ of small chamber 7 is set at 30 mm to ensure that doped melt in small chamber 7 can be mixed with melt in inner chamber 10 in a few minutes (the mixing effect has been confirmed by experiment).

Figure 3:
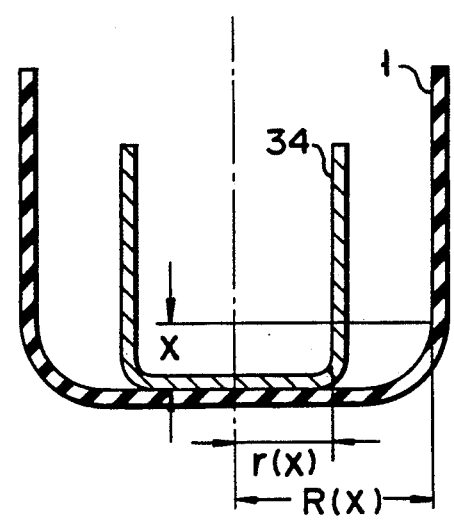
FIG. 3 is a sectional view of a modification of the double crucible structure shown in FIG. 1.

The shapes of outer crucible 1 and partition wall 4 are not limited to the combination of cylindrical container and cylindrical wall as shown in FIG. 1, but can be a combination of two crucibles 1 and 34 whose bottom surfaces are bonded to each other as shown in FIG. 3. In other words, the crucible structure except the bonding portion which is not used for crystal pulling ca be formed in a desired form if radius R of outer chamber 11 and radius r of inner chamber 10 substantially satisfy the relation of $r = \sqrt{k \cdot R}$. In this case, R (or R(X)) is an inner radius of outer crucible 1 at the height x of the surface level of melt; and r (or r(x)) is an inner radius of partition wall (Inner chamber) 34 at the height x of the surface level of melt (See FIG. 3).

When the above relation between radius r of the inner chamber and inner radius R of outer chamber 11 is satisfied, the impurity concentration in the longitudinal direction of single crystal 12 pulled from the inner chamber can be kept constant unless more dopant is added.

Now, it is explained with reference to FIG. 4 that the impurity concentration distribution in the longitudinal direction of the crystal grown by use of the apparatus shown in FIG. 1 has a series of impurity concentration constant regions formed according to the number of dopings. In FIG. 4, the abscissa indicates the solidification ratio and the ordinate indicates the resistivity. Single crystal of 5"ϕ with a direction of Miller indices (100) was grown in the manufacturing condition that the inner diameter of the outer crucible was approx. 390 mm (16"ϕ), the inner diameter of the inner crucible was approx. 230 mmϕ, r/R was set to 0.59, the amount of introduced silicon was 30 kg, and phosphorus was used as doping impurity. In this case, the process of introducing dopant 9 was effected five times. The first dopant introducing step was effected by dropping dopant 9 into small chamber 7 via doing tube 8 shown in FIG. 1 after polysilicon material has been melt and the melt surfaces in the inner and outer chambers were kept at constant levels. The second and succeeding dopant introducing steps were effected by dropping dopant 9 into small chamber 7 via doping tube 8 during the crystal growth after the growing crystal came to have the straight body.

FIG. 4 shows the resistivity distribution in the longitudinal direction of single crystal 12 which can be attained in the case where the single crystal is formed by effecting the doping process each time the single crystal is pulled by the weight of 5 kg after growing crystal 12 has come to have the straight body $12a$. This process has been effected for the purpose of forming a single crystal which includes five different regions respectively having constant resistivities of $\sim 100\Omega \cdot \text{cm}$, $\sim 10\Omega \cdot \text{cm}$, $\sim 1\Omega \cdot \text{cm}$, $\sim 0.1\Omega \cdot \text{cm}$, and $\sim 0.01\Omega \cdot \text{cm}$ in the longitudinal direction thereof. As is clearly seen from FIG. 4, the purpose of forming the desired single crystal having a series of constant-resistivity regions in the longitudinal direction thereof can be achieved.

It was further confirmed that in-plane distribution variation $\Delta \rho$ of the resistance of the Si wafer obtained from the pulled single crystal ranged from 5 to 9 % and was substantially equal to that attained in the case of the Si wafer obtained by the CZ method.

Figure 5:
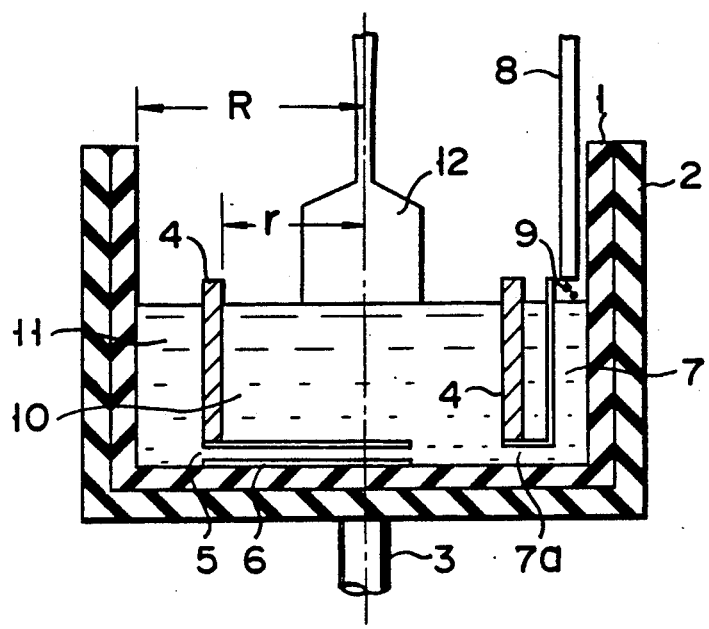
FIG. 5 is detailed sectional view of a portion of a crystal pulling apparatus using a double crucible according to another embodiment of this invention.
Figure 6:
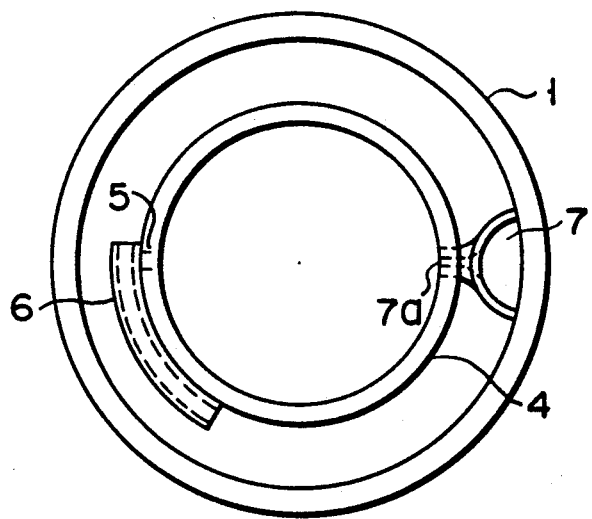
FIG. 6 is a top plan view of the double crucible of FIG. 5.

FIG. 5 is a sectional view of a crystal pulling apparatus using double crucible according to another embodiment of this invention. FIG. 6 is a top view of the double crucible of FIG. 5.

In the embodiment of FIG. 1, small chamber 7 is mounted on partition wall 4, but in the embodiment of FIG. 5, small chamber 7 is mounted on outer crucible 1. In this case, since a heater is arranged around outer crucible 1, the temperature of the inner wall of outer crucible 1 becomes higher than that of partition wall 4. As a result, dopant 9 can be rapidly dissolved into melt in small chamber 7 in comparison with the case of FIG. 1.

Figure 7:
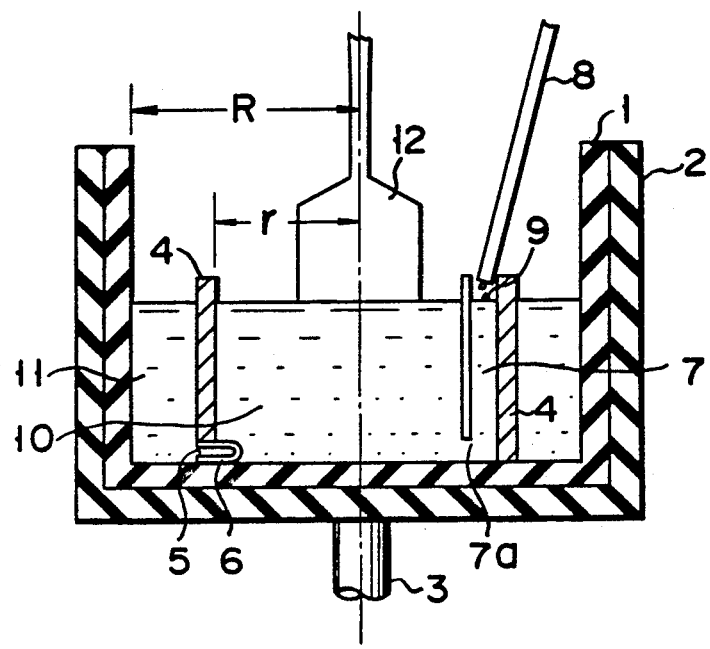
FIG. 7 is sectional view of the detail portion of a crystal pulling apparatus using a double crucible according to still another embodiment of this invention.
Figure 8:
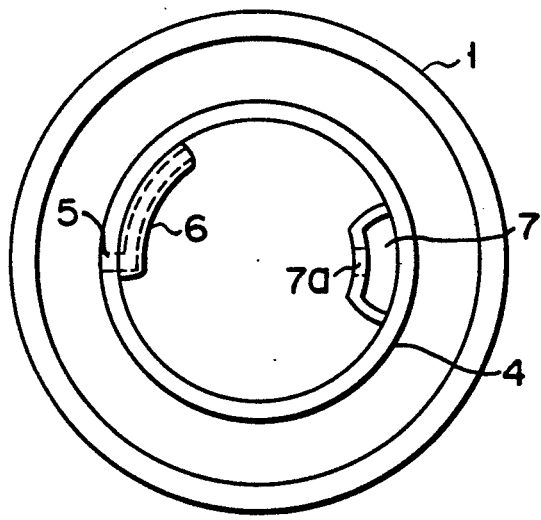
FIG. 8 is a top plan view of the double crucible of FIG. 7.

FIG. 7 is a sectional view of crystal pulling apparatus using a double crucible according to still another embodiment of this invention. FIG. 8 is a top plan view of the double crucible of FIG. 7.

In the embodiment of FIG. 1, pipe-like passage 6 and small chamber 7 are mounted outside partition wall 4, but in the embodiment of FIG. 7, pipe-like passage 6 and small chamber 7 are mounted inside partition wall 4. With this construction, since no projecting portion exists outside the inner crucible surrounded by partition wall 4, in becomes easy to increase radius r of the inner crucible with respect of radius R of outer crucible 1.

In the above embodiments, the double crucible is used, but this invention can also be applied to a triple crucible in which the double crucible of FIG. 1 is set in a third crucible, for example.

Small chamber 7, communication hole 7a, partition wall penetration hole 5 and pipe 6 is not limited to one of each. For example, it is possible to form two communication holes in one small chamber 7, or provide two or three pipes 6 on the bottom surface of partition wall 4.

It is possible to use a heat resistant material other than quartz, such as Pyrolytic Boron Nitride (PBN), $Si_3N_4$, or SiC, as the material of the crucible (1, 4, 34), small chamber 7 and pipe 6. Further, it is possible to coat the surface of the crucible, small chamber and pipe with PBN, $Si_3N_4$, or SiC.

This invention is not limited to the production of single silicon crystal, but can be applied to the production of a crystal of germanium or gallium arsenide. The crystal growth speed of gallium arsenide (approx. 0.1 mm/min) is relatively slow in comparison with that of silicon (approx. 1 mm/min). Therefore, it is necessary to change the diameter of communication hole 7a of small chamber 7, inner diameter and length of pipe 6 from those of this invention when the gallium arsenide crystal is formed.

According to the apparatus and method of this invention, a double structure crucible having $R/r = \sqrt{k}$ is used with the advantage of the CZ technique—that the in-plane distribution of dopant impurity in the single crystal can be set relatively constant—is maintained. In this case, since dopant is intermittently introduced from the small chamber into the melt in the inner chamber, it becomes possible to grow single crystals with a series of impurity-constant regions which respectively have desired impurity concentration values varying in the longitudinal direction thereof. As a result, according to this invention, it is possible to produce single crystals which can be efficiently used to form a large number of groups each having different impurity concentrations and each including a small number of wafers of the same impurity concentration.

What is claimed is:
1. A crystal pulling apparatus comprising:
an outer crucible with a radius R for receiving undoped melt, said outer crucible having a wall surface;
an inner crucible coaxially disposed in said outer crucible, for receiving doped melt, said inner crucible having a radius r which is substantially $\sqrt{k}$ times the radius R when the segregation coefficient of dopant of the doped melt is k;
a small chamber in communication with said inner crucible via a preset communication hole which is placed under the surface of the doped melt in the inner crucible, dopant being selectively introduced into the doped melt in said small chamber; and
means for introducing the undoped melt in said outer crucible into said inner crucible.

2. A crystal pulling apparatus according to claim 1, wherein said introducing means includes means for unidirectionally transferring the undoped melt in said outer crucible into the doped melt in said inner crucible.

3. A crystal pulling apparatus according to claim 1, wherein said introducing means includes a hole formed in the outer wall of the bottom of said inner crucible and the undoped melt in said outer crucible is introduced into said inner crucible via said hole.

4. A crystal pulling apparatus according to claim 1, wherein said introducing means includes a hole formed in an isolation wall of the bottom portion of said inner crucible and a pipe connected to said hole, and the undoped melt in said outer crucible is introduced into said inner crucible via said hole and pipe.

5. A crystal pulling apparatus according to claim 1, wherein said inner crucible has a partition wall section for isolating the doped melt received therein from the undoped melt and said small chamber is mounted on said partition wall section.

6. A crystal pulling apparatus according to claim 5, wherein said small chamber is disposed outside said inner crucible and inside said outer crucible.

7. A crystal pulling apparatus according to claim 5, wherein said small chamber is disposed inside said inner crucible.

8. A crystal pulling apparatus according to claim 1, wherein said small chamber is disposed outside said inner crucible and inside said outer crucible, on the wall surface of said outer crucible.

9. A crystal pulling apparatus according to claim 1, wherein the material of said inner crucible and outer crucible includes quartz.

10. A crystal pulling apparatus according to claim 1, wherein the material of said inner crucible and outer crucible includes any one of Pyrolytic Boron Nitride, $Si_3N_4$, and SiC.

11. A crystal pulling apparatus comprising a crucible which includes a crucible body; a cylindrical partition wall section for dividing said crucible body into inner and outer chambers and said inner chamber having a radius substantially equal to k times a radius of said crucible body when the segregation coefficient of the dopant is k; a melt supplying path formed in said partition wall section; and a small chamber formed in communication with said inner chamber at the lower portion of said partition wall section.

* * * * *